United States Patent
Zhang et al.

(10) Patent No.: US 8,735,300 B1
(45) Date of Patent: May 27, 2014

(54) METHOD OF FORMING CONTACT HOLE

(71) Applicant: Shanghai Huali Microelectronics Corporation, Shanghai (CN)

(72) Inventors: Yu Zhang, Shanghai (CN); Jun Huang, Shanghai (CN); Chenguang Gai, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/730,486

(22) Filed: Dec. 28, 2012

(30) Foreign Application Priority Data

Nov. 12, 2012 (CN) .......................... 2012 1 0451655

(51) Int. Cl.
*H01L 21/00* (2006.01)
(52) U.S. Cl.
USPC .......................................... 438/735; 438/623
(58) Field of Classification Search
USPC ......... 438/623–624, 637, 723–725, 743–744, 438/735
See application file for complete search history.

(56) References Cited

U.S. PATENT DOCUMENTS

| 2008/0108216 A1* | 5/2008 | Lee et al. ....................... 438/597 |
| 2008/0124876 A1* | 5/2008 | Ryu .............................. 438/296 |

\* cited by examiner

*Primary Examiner* — Richard Booth
(74) *Attorney, Agent, or Firm* — Muncy, Geissler, Olds & Lowe, P.C.

(57) ABSTRACT

A method of forming contact hole is disclosed, including the steps of: providing a semiconductor substrate having a first dielectric layer, a second dielectric layer and a third dielectric layer formed thereon in this order; forming a first contact hole through the third dielectric layer, the second dielectric layer and the first dielectric layer by using an etching process to expose the semiconductor substrate; removing the third dielectric layer; forming a fourth dielectric layer over the second dielectric layer, the fourth dielectric layer filling the first contact hole; forming a second contact hole through the fourth dielectric layer, the second dielectric layer and the first dielectric layer to expose the semiconductor substrate; and removing the fourth dielectric layer. The method is capable of improving the stability of the contact-hole formation process.

10 Claims, 7 Drawing Sheets

METHOD OF FORMING CONTACT HOLE

CROSS-REFERENCES TO RELATED APPLICATIONS

This application claims the priority of Chinese patent application number 201210451655.1, filed on Nov. 12, 2012, the entire contents of which are incorporated herein by reference.

TECHNICAL FIELD

The present invention relates to semiconductor fabrication, and more particularly, to a method of forming contact hole.

BACKGROUND

With the development of the semiconductor fabrication into the 40 nm technology node and below, the reduction in both the size of contact holes and the interval between contact holes has imposed great challenges to the photolithography/etching processes during the formation of contact holes. It has become an important issue to both ensure a good exposure result and prevent a short circuit of the contact holes after etching.

FIGS. 1 to 8 show a method of forming contact hole of the prior art. Reference is first made to FIG. 1 which illustrates a semiconductor substrate 10 on which a first dielectric layer 11, a second dielectric layer 12, a third dielectric layer 13 (which is an advanced pattern film (APF)), a dielectric anti-reflective coating (DARC) layer 14, a first bottom anti-reflective coating (BARC) layer 15 and a first photoresist layer 16 are formed. A first opening is formed in the first photoresist layer 16, exposing the underlying first BARC layer 15.

Next, referring to FIG. 2 which illustrates that a second opening is formed in the first BARC layer 15 and a third opening is formed in the DARC layer 14 after an etching process has been performed along the first opening. The third opening has a depth smaller than a thickness of the DARC layer 14. The second and third openings are interconnected.

After that, referring to FIG. 3 which illustrates the structure after the first photoresist layer 16 and the first BARC layer 15 are removed.

Next, referring to FIG. 4 which illustrates the structure after a second BARC layer 17 and a second photoresist layer 18 are formed on the DARC layer 14. The second BARC layer 17 fills the third opening. A fourth opening is formed in the second photoresist layer 18, exposing the underlying second BARC layer 17.

After that, referring to FIG. 5 which illustrates that a fifth opening is formed in the second BARC layer 17 and a sixth opening is formed in the DARC layer 14 after an etching process has been performed along the fourth opening. The sixth opening has a depth smaller than the thickness of the DARC layer 14. The fifth and sixth openings are interconnected.

Next, referring to FIG. 6 which illustrates the structure after the second BARC layer 17 and the second photoresist layer 18 are removed.

After that, referring to FIG. 7 which illustrates that a first contact hole and a second contact hole are formed after etching processes have been performed to the third dielectric layer 13, the second dielectric layer 12 and the first dielectric layer 11 along the respective third opening and sixth opening. The first contact hole is situated below the third opening while the second contact hole is situated below the sixth opening.

At last, referring to FIG. 8 which illustrates the structure after the DARC layer 14 is removed.

However, in practice, after the performance of the step shown in FIG. 4, namely after forming the fourth opening in the second photoresist layer 18, if the fourth opening does not achieve a desired diameter, a repetition process, namely removing the second photoresist layer 18 and the second BARC layer 17 by etching and repeating the step shown in FIG. 4, must be carried out until the diameter of the newly formed fourth opening meets the requirement. In such repetition process, the third opening may be damaged and widened during the etching step for removing the second BARC layer 17, which will lead to a too large diameter of the first contact hole that will be formed under the third opening. Therefore, there is a need to improve the stability of the contact-hole formation process of the prior art.

SUMMARY OF THE INVENTION

The present invention addresses the above issue by presenting a method of forming contact hole which is capable of solving the contact hole diameter increase issue and hence improving the stability of the contact-hole formation process.

In order to achieve the above objective, the method of forming contact hole provided by the present invention includes the steps of:

providing a semiconductor substrate having a first dielectric layer, a second dielectric layer and a third dielectric layer formed thereon in this order;

forming a first contact hole through the third dielectric layer, the second dielectric layer and the first dielectric layer by using an etching process to expose the semiconductor substrate;

removing the third dielectric layer;

forming a fourth dielectric layer over the second dielectric layer, the fourth dielectric layer filling the first contact hole;

forming a second contact hole through the fourth dielectric layer, the second dielectric layer and the first dielectric layer to expose the semiconductor substrate; and removing the fourth dielectric layer.

In an embodiment, the step of forming the first contact hole includes:

forming a first dielectric anti-reflective coating layer, a first bottom anti-reflective coating layer, and a first photoresist layer in which a first opening is formed, over the third dielectric layer in this order;

etching the first bottom anti-reflective coating layer, the first dielectric anti-reflective coating layer, the third dielectric layer, the second dielectric layer and the first dielectric layer along the first opening to form the first contact hole to expose the underlying semiconductor substrate; and removing the first photoresist layer, the first bottom anti-reflective coating layer, the first dielectric anti-reflective coating layer and the third dielectric layer.

In an embodiment, the first BARC layer is formed of a crosslinkable high molecular polymer and has a thickness within the range of 200 Å to 400 Å.

In an embodiment, the first DARC layer is formed of silicon oxynitride and has a thickness within the range of 200 Å to 400 Å.

In an embodiment, the step of forming the second contact hole includes:

forming a second DARC layer, a second BARC layer, and a second photoresist layer in which a second opening is formed, over the fourth dielectric layer in this order;

etching the second BARC layer, the second DARC layer, the fourth dielectric layer, the second dielectric layer and the first dielectric layer along the second opening to form the second contact hole to expose the underlying semiconductor substrate; and removing the second photoresist layer, the second BARC layer and the second DARC layer.

In an embodiment, the second BARC layer is formed of a crosslinkable high molecular polymer and has a thickness within the range of 300 Å to 500 Å.

In an embodiment, the second DARC layer is formed of silicon oxynitride and has a thickness within the range of 300 Å to 500 Å.

In an embodiment, the fourth dielectric layer is formed of amorphous carbon and has a thickness within the range of 1500 Å to 2500 Å.

In an embodiment, the third dielectric layer is formed of amorphous carbon and has a thickness within the range of 1500 Å to 2500 Å.

In an embodiment, the first dielectric layer is foamed of silicon nitride and the second dielectric layer is formed of silicon oxide.

Compared with the prior art, the present invention has advantages as follows:

The method of forming contact hole of the present invention first forms the first contact hole and then forms, over the first contact hole, a fourth dielectric layer that can protect the first contact hole during the subsequent etching processes. The influence of repetition process on the diameter of the first contact hole can be avoided and hence the stability of the whole process can be improved.

DETAILED DESCRIPTION

Figure 1:
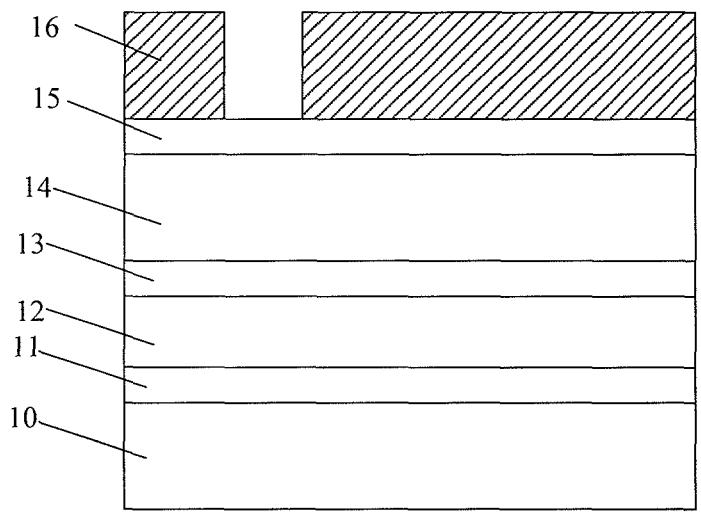
FIGS. 1 to 8 are cross-sectional views illustrating a method of forming contact hole of the prior art.
Figure 2:
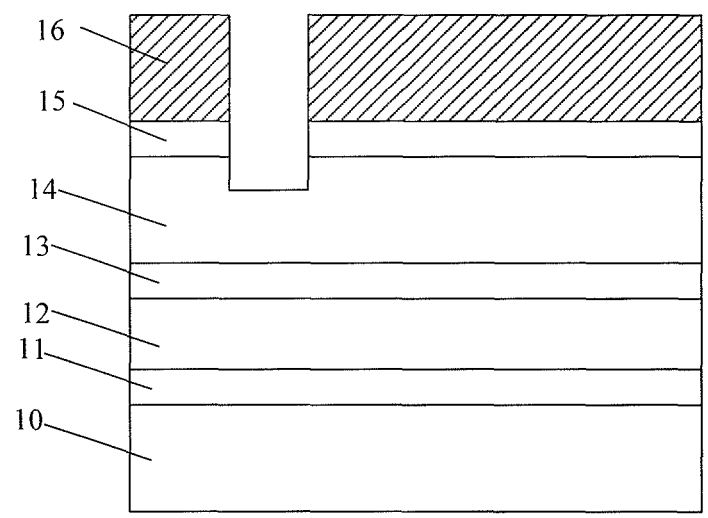
Figure 3:
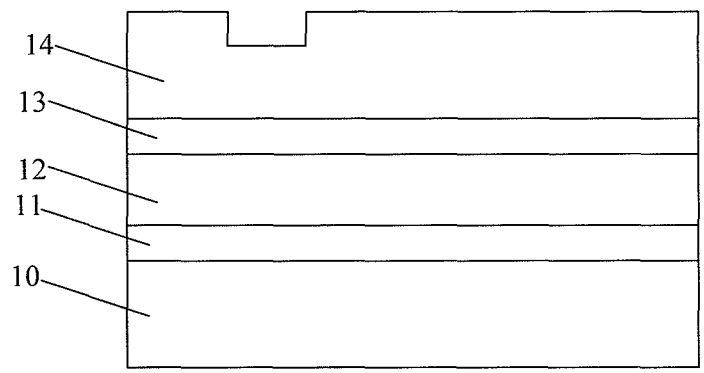
Figure 4:
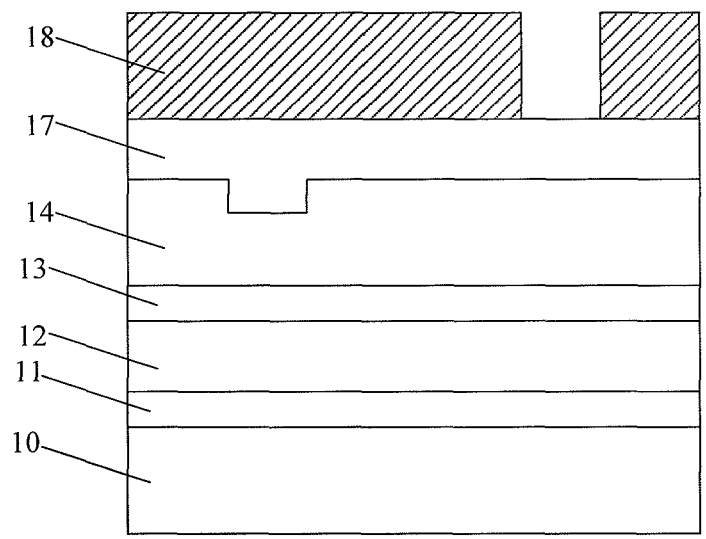
Figure 5:
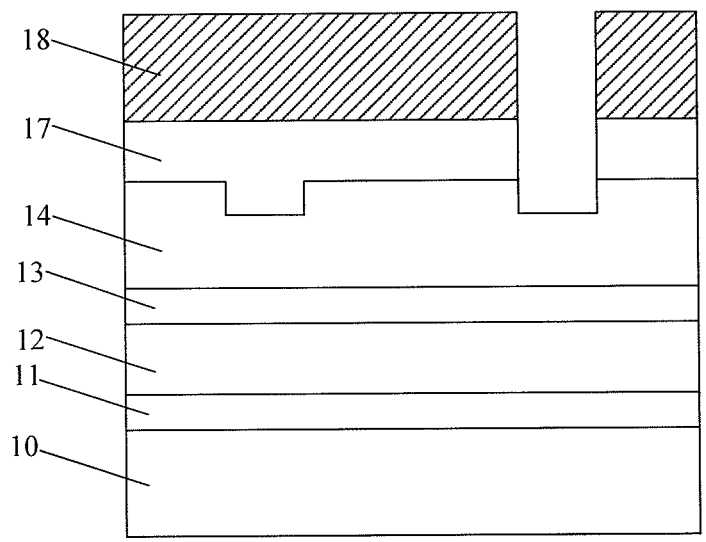
Figure 6:
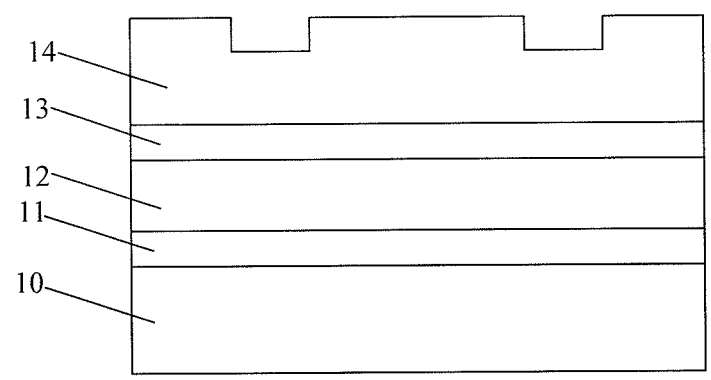
Figure 7:
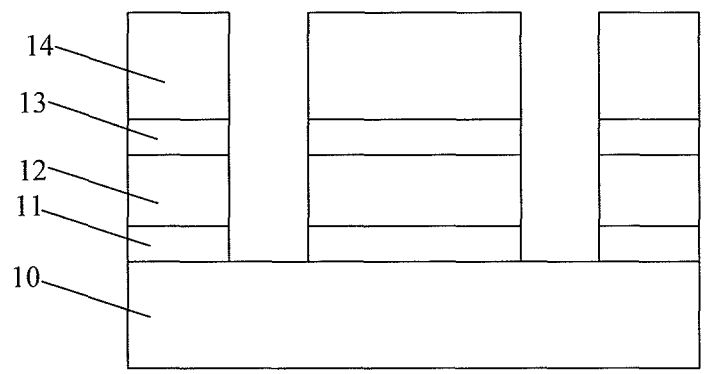
Figure 8:
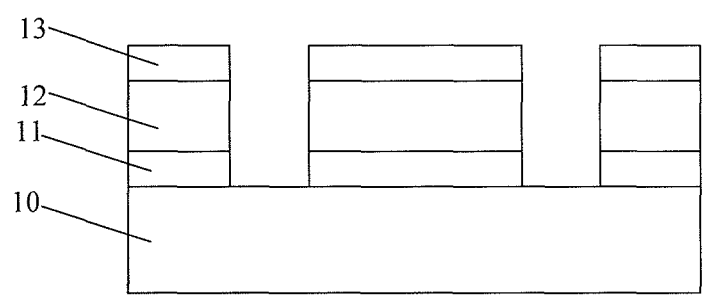
Figure 9:
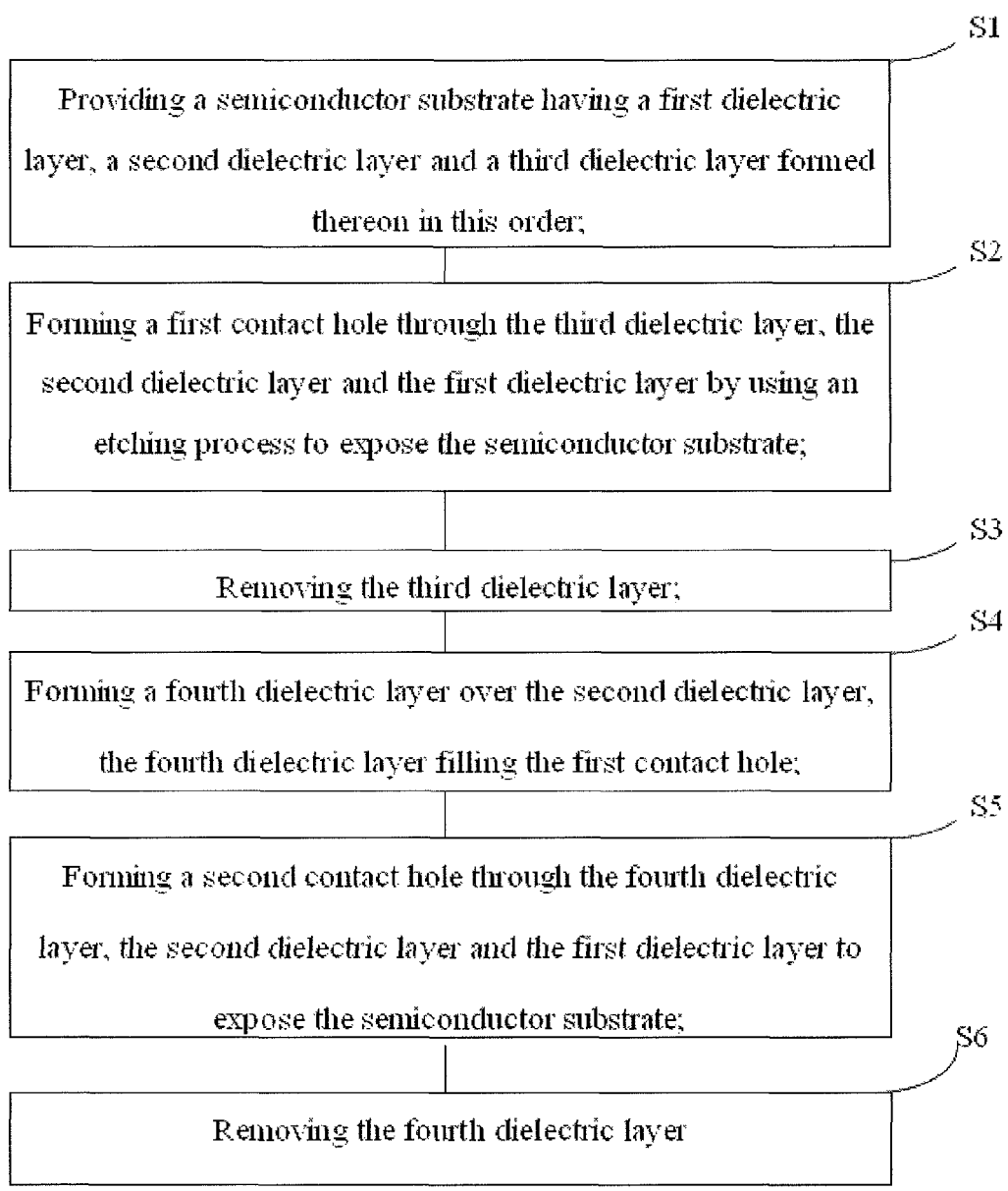
FIG. 9 is a schematic diagram illustrating the flow of a method of forming contact hole according to an embodiment of the present invention.

The existing method of forming contact hole is lack of stability, of which the repetition process may lead to a widened first contact hole. To solve this problem, the present invention provides a method of forming contact hole which will be described below with reference to FIG. 9, which is a schematic diagram illustrating the flow of the method of forming contact hole according to an embodiment of the present invention. The method includes the steps of:

S1: providing a semiconductor substrate having a first dielectric layer, a second dielectric layer and a third dielectric layer formed thereon in this order;

S2: forming a first contact hole through the third dielectric layer, the second dielectric layer and the first dielectric layer by using an etching process to expose the semiconductor substrate;

S3: removing the third dielectric layer;

S4: forming a fourth dielectric layer over the second dielectric layer, the fourth dielectric layer filling the first contact hole;

S5: forming a second contact hole through the fourth dielectric layer, the second dielectric layer and the first dielectric layer to expose the semiconductor substrate; and S6: removing the fourth dielectric layer.

The present invention will be described and specified below with reference to accompanying drawings FIGS. 10 to 14, which are cross-sectional views illustrating the method of forming contact hole according to an embodiment of the present invention.

Figure 10:
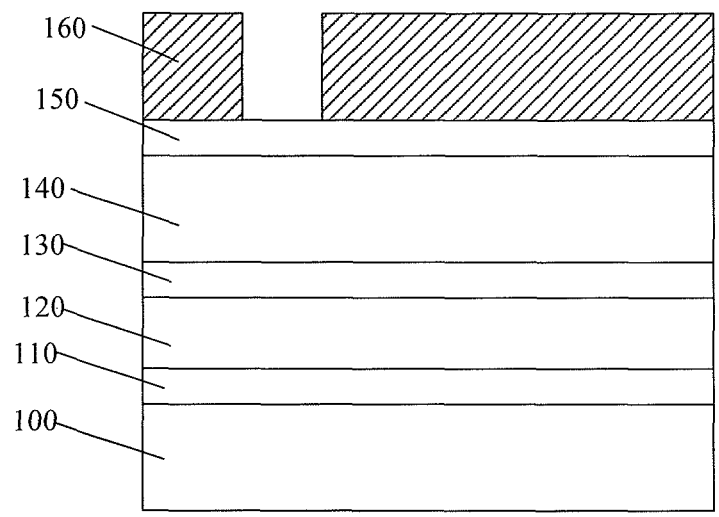
FIGS. 10 to 14 are cross-sectional views illustrating a method of forming contact hole according to an embodiment of the present invention.

As shown in FIG. 10, a semiconductor substrate 100 is provided at first, a first dielectric layer 110, a second dielectric layer 120 and a third dielectric layer 130 are formed on the semiconductor substrate 100 in this order. Next, a first dielectric anti-reflective coating (DARC) layer 140, a first bottom anti-reflective coating (BARC) layer 150, and a first photoresist layer 160 in which a first opening is formed, are formed over the third dielectric layer 130 in this order. The first opening is Ruined to define the size, shape and position of a first contact hole described below. In one embodiment, the third dielectric layer 130 is formed of amorphous carbon and has a thickness within the range of 1500 Å to 2500 Å. In this embodiment, the thickness of the third dielectric layer 130 is 2000 Å. In one embodiment, the first dielectric layer 110 is formed of silicon nitride and the second dielectric layer 120 is formed of silicon oxide.

Figure 11:
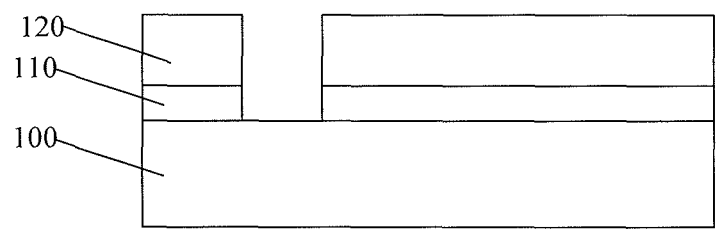

After that, as shown in FIG. 11, the first BARC layer 150, the first DARC layer 140, the third dielectric layer 130, the second dielectric layer 120 and the first dielectric layer 110 are etched along the first opening so as to form the first contact hole to expose the underlying semiconductor substrate 110. Next, the first BARC layer 150, the first DARC layer 140 and the third dielectric layer 130 are removed.

In one embodiment, the first BARC layer 150 is formed of a crosslinkable high molecular polymer and has a thickness within the range of 200 Å to 400 Å. The first DARC layer 140 is formed of silicon oxynitride and has a thickness within the range of 200 Å to 400 Å.

Figure 12:
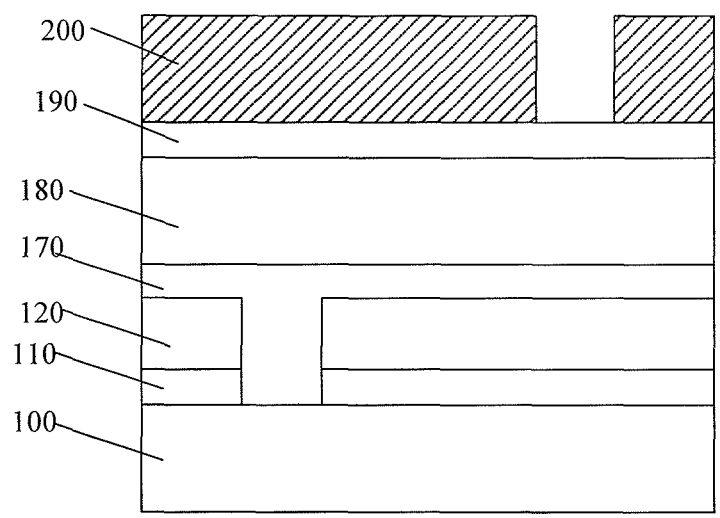

Next, as shown in FIG. 12, a fourth dielectric layer 170 is formed over the second dielectric layer 120, filling the first contact hole. The fourth dielectric layer 170 is formed of amorphous carbon and has a thickness within the range of 1500 Å to 2500 Å. In this embodiment, the thickness of the fourth dielectric layer 170 is 2000 Å.

After that, a second DARC layer 180, a second BARC layer 190, and a second photoresist layer 200 in which a second opening is formed, are formed over the fourth dielectric layer 170 in this order. The second opening is formed to define the size, shape and position of a second contact hole described below.

Figure 13:
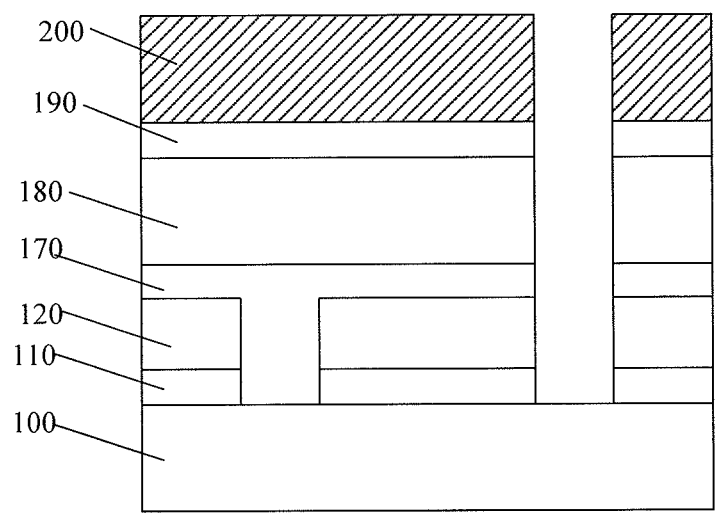

Next, as shown in FIG. 13, the second BARC layer 190, the second DARC layer 180, the fourth dielectric layer 170, the second dielectric layer 120 and the first dielectric layer 110 are etched along the second opening to form the second contact hole, the second contact hole exposing the underlying semiconductor substrate 100 at its bottom. In one embodiment, the second BARC layer 190 is formed of a crosslinkable high molecular polymer and has a thickness within the range of 300 Å to 500 Å. The second DARC layer 180 is formed of silicon oxynitride and has a thickness within the range of 300 Å to 500 Å.

Figure 14:
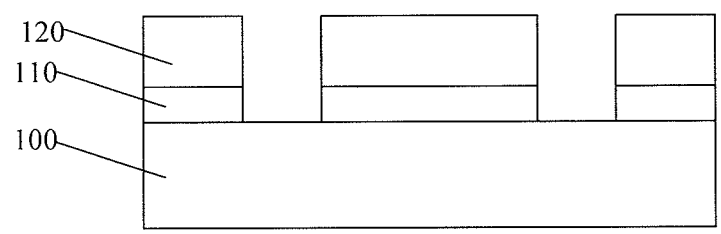

At last, as shown in FIG. 14 and also refer to FIG. 13, the second photoresist layer 200, the second BARC layer 190, the second DARC layer 180 and the fourth dielectric layer 170 are removed.

According to foregoing description, the method of forming contact hole of the present invention first forms the first contact hole and then forms, over the first contact hole, a fourth dielectric layer that can protect the first contact hole during the subsequent etching processes, and therefore, the influence of repetition process on the diameter of the first contact hole during the formation of the second contact hole can be avoided and hence the stability of the whole process can be improved.

The foregoing preferred embodiments are provided only for the purpose of describing the technological scheme and characteristics pertained to the invention, and are not intended to limit the invention in any way. Rather, the foregoing detailed description provides those skilled in the art with a foundation for understanding and the present invention and implementing it thereby. Modifications and substitutions can be made without departing from the nature or the spirit of the present invention, and are contemplated to be within the scope of the present invention.

What is claimed is:

1. A method of forming contact hole, comprising the steps of:
    providing a semiconductor substrate having a first dielectric layer, a second dielectric layer and a third dielectric layer formed thereon in this order;
    forming a first contact hole through the third dielectric layer, the second dielectric layer and the first dielectric layer by using an etching process to expose the underlying semiconductor substrate;
    removing the third dielectric layer;
    forming a fourth dielectric layer over the second dielectric layer, the fourth dielectric layer filling the first contact hole;
    forming a second contact hole through the fourth dielectric layer, the second dielectric layer and the first dielectric layer to expose the underlying semiconductor substrate; and
    removing the fourth dielectric layer.

2. The method according to claim 1, wherein forming a first contact hole includes:
    forming, over the third dielectric layer, a first dielectric anti-reflective coating layer, a first bottom anti-reflective coating layer, and a first photoresist layer in which a first opening is formed;
    etching the first bottom anti-reflective coating layer, the first dielectric anti-reflective coating layer, the third dielectric layer, the second dielectric layer and the first dielectric layer along the first opening to form the first contact hole to expose the underlying semiconductor substrate; and
    removing the first photoresist layer, the first bottom anti-reflective coating layer, the first dielectric anti-reflective coating layer and the third dielectric layer.

3. The method according to claim 2, wherein the first bottom anti-reflective coating layer is formed of a crosslinkable high molecular polymer and has a thickness within the range of 200 Å to 400 Å.

4. The method according to claim 2, wherein the first dielectric anti-reflective coating layer is formed of silicon oxynitride and has a thickness within the range of 200 Å to 400 Å.

5. The method according to claim 1, wherein forming a second contact hole includes:
    forming, over the fourth dielectric layer, a second dielectric anti-reflective coating layer, a second bottom anti-reflective coating layer, and a second photoresist layer in which a second opening is formed;
    etching the second bottom anti-reflective coating layer, the second dielectric anti-reflective coating layer, the fourth dielectric layer, the second dielectric layer and the first dielectric layer along the second opening to form the second contact hole to expose the underlying semiconductor substrate; and
    removing the second photoresist layer, the second bottom anti-reflective coating layer and the second dielectric anti-reflective coating layer.

6. The method according to claim 5, wherein the second bottom anti-reflective coating layer is formed of a crosslinkable high molecular polymer and has a thickness within the range of 300 Å to 500 Å.

7. The method according to claim 5, wherein the second dielectric anti-reflective coating layer is formed of silicon oxynitride and has a thickness within the range of 300 Å to 500 Å.

8. The method according to claim 1, wherein the fourth dielectric layer is formed of amorphous carbon and has a thickness within the range of 1500 Å to 2500 Å.

9. The method according to claim 1, wherein the third dielectric layer is formed of amorphous carbon and has a thickness within the range of 1500 Å to 2500 Å.

10. The method according to claim 1, wherein the first dielectric layer is formed of silicon nitride and the second dielectric layer is formed of silicon oxide.

* * * * *